United States Patent [19]
Laub

[11] Patent Number: 5,273,442
[45] Date of Patent: Dec. 28, 1993

[54] MODULAR CHIP CARRIER SOCKET

[75] Inventor: Michael F. Laub, Etters, Pa.

[73] Assignee: The Whitaker Corporation, Wilmington, Del.

[21] Appl. No.: 996,546

[22] Filed: Dec. 24, 1992

[51] Int. Cl.$^5$ ............................................ H01R 23/72
[52] U.S. Cl. ................................... 439/73; 439/526
[58] Field of Search ............................ 439/68-73, 439/525, 526

[56] References Cited

U.S. PATENT DOCUMENTS

| | | | |
|---|---|---|---|
| 4,530,554 | 7/1985 | Velsher et al. | 439/71 |
| 4,699,593 | 10/1987 | Grabbe et al. | 439/71 |
| 5,007,845 | 4/1991 | Grabbe et al. | 439/73 |
| 5,062,802 | 11/1991 | Grabbe | 439/72 |
| 5,236,367 | 8/1993 | McHugh et al. | 439/73 |

*Primary Examiner*—Neil Abrams
*Attorney, Agent, or Firm*—Driscoll A. Nina, Jr.

[57] ABSTRACT

A modular chip carrier socket of integral construction and method of making the same for electrically engaging the leads of an integrated chip carrier to the conductors on a substrate that structurally simulates the monolithic molded plastic construction of chip carrier specific sockets. Where the modular socket is designed for minimal lead time manufacture of nonstandard sockets with limited application specific components. Standard contact modules, supporting contacts therein, are permanently affixed to an application specific base plate to form a socket of modular construction prior to assembly of the socket upon the substrate. An embodiment of the invention has improved thermal characteristics over the molded sockets by using a base plate having the same coefficient of thermal expansion as the substrate.

10 Claims, 7 Drawing Sheets

MODULAR CHIP CARRIER SOCKET

FIELD OF THE INVENTION

This invention relates to sockets for integrated chip carriers having the chip contained within a carrier body and leads extending therefrom.

BACKGROUND OF THE INVENTION

The present invention relates to chip carrier sockets used to attach the leads extending from a chip carrier to conductors on a substrate. The primary advantage to using these sockets is that they allow for removal of the chip carrier without having to undertake the tedious disconnection and reconnection tasks associated with soldered surface mount connections. Use of these sockets is then particularly appropriate where the device is expected to be upgraded, prone to failure or at the prototype level where it may be necessary to remove a chip carrier for testing and debugging purposes.

Figure 1:
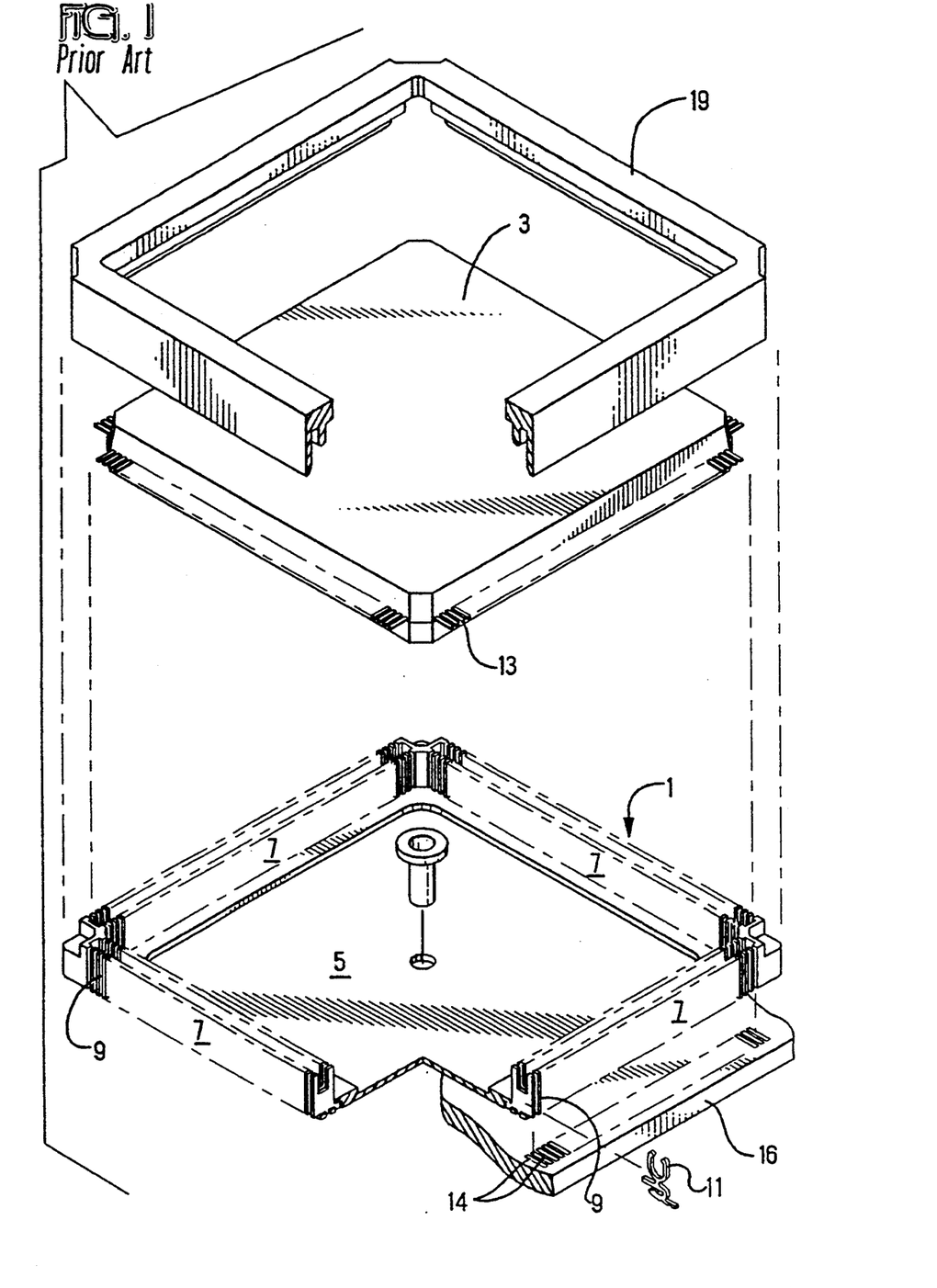
FIG. 1 is a prior art chip carrier specific molded socket body and assembly.

In U.S. Pat. No. 5,007,845, a low height socket is disclosed (see FIG. 1) that uses a tuning fork shaped contact 11 within a socket body 1 and a cover 19 that acts to wedge the leads 13 of the chip carrier 3 into electrical engagement with the contacts 11. By removing the cover 19, the chip carrier 3 can be easily replaced. As shown in FIG. 1, the socket body 1 is of monolithic molded plastic construction and is specifically designed to accommodate the particular chip carrier 3. The socket body 1 has a bottom 5 and four upstanding walls 7 extending therefrom. A plurality of slots 9 are disposed in the walls for receiving contacts 11 that correspond to the leads 13 of the chip carrier 3 to be electrically connected to the conductors 15 on the substrate 17. These socket bodies 1 require an intricate mold that requires a significant amount of time to produce due to the complex and small features that must be incorporated which results in a high initial expense.

An advantage of a chip carrier socket is that the electrical connection between the chip carrier leads and the conductors on the substrate is more easily interchanged than when the leads are directly connected to the conductors, such as by soldering. A particular contact and socket assembly that facilitates easy assembly and disassembly is described in U.S. patent application Ser. No. 07/969,597, which was filed Oct. 30, 1992 is hereby incorporated by reference as though set forth verbatim herein.

The invention of the referenced application includes a tool receiving recess within the contacts so that support may be provided to prevent the forces associated with inserting the cover from being transferred to the contact/conductor connection. This tool receiving recess enhances the usefulness of the sockets in the product development stage of substrate design where it may be necessary to remove and replace the chip carrier a number of times by protecting the electrical connection between the contact and the conductor.

As more and more complicated chip configurations are developed the number of leads extending from the chip carrier and the overall size of the chip carrier are apt to change. Furthermore, it is likely that chip carriers will be designed specifically for a particular application. Socket assemblies are particularly useful with these specialized chip carriers due to their ability to maintain electrical engagement with the conductors while the chip carrier is being installed and removed a number of times. It is likely that many specialized applications will include large chip carriers, such as 4 inches by 4 inches. In these uses, it is especially important to maintain the coefficients of thermal expansion between the socket body and the substrate essentially identical in order to maintain alignment of the contacts and the conductors with minimal stress being imposed on the interface.

However, it typically is not economically feasible during the product development stage to justify the expense or lead time associated with chip carrier specific molded socket bodies for non-standard chip carrier configurations. U.S. Pat. No. 5,062,802 addresses this problem by creating a socket-like seat from a number of contact modules containing contacts electrically connect the chip carrier leads to the conductors on the substrate. A removable plate is used to orientate the modules so that the contacts housed therein correspond to the conductors on the substrate and the expected position of the leads. Once the contacts are engaged with the conductors on the substrate the plate is removed.

A problem with the '802 invention is that it is not suitable for applications involving quantities above initial prototype applications. The construction techniques are awkward and time intensive. The '802 invention does not provide a user-friendly socket body because a distinct chip carrier socket body is not really created. Therefore, it is not possible to use the invention with the same board loading equipment that would be used with a chip carrier specific molded socket body.

Therefore, to enable chip carrier sockets to reach their presently envisioned potential what is needed is a chip carrier socket for non-standard chip carriers that is economically viable at low levels of production and has the characteristics of a chip carrier specific molded socket body without the associated high tooling costs and long lead times. The socket would be useful in product development where the advantages of socket assembly of chip carrier to substrate are most applicable. Chip carrier sockets would also be usable in unique applications where, due to the quantities involved, it may never be feasible to utilize a chip carrier specific molded socket body. Finally, because the socket would have the characteristics of a monolithic molded socket body, the socket body would enable production of substrates that are going to use a chip carrier specific molded socket body while the molded body is being developed, thereby enabling the set up of production board loading equipment without the delay of waiting for the molded components.

SUMMARY OF THE INVENTION

The present invention is a integral chip carrier socket body of modular construction that is similar to a chip carrier specific monolithic molded body. The modular chip carrier socket body comprises standard contacts incorporated into standard contact modules that are permanently affixed to an application specific base plate, thereby creating a integral structure. The base plate is easily and inexpensively constructed from a sheet of material, typically the same as the substrate, with simple alignment features incorporated therein for orientating the contact modules into a socket frame. As used in the present application the term "contact module" means a contact body section or portion thereof having contacts disposed therein.

It is an object of this invention to provide a integrally constructed socket body that enables relatively low quantities of non-standard chip carrier socket bodies to be produced quickly and cost effectively. It is another object of this invention to provide a chip carrier socket body of integral construction that is usable with standard board loading equipment. It is a yet another object of this invention to provide a low cost chip carrier socket body of integral construction adapted to be removable from the substrate. It is a further object of this invention to minimize the stress imposed on the contact/conductor interface caused by the thermal expansion of a chip carrier socket being different than that of the substrate.

It is a feature of this invention that only the base plate is application specific. It is another feature of this invention that the base plate can be easily manufactured based upon the characteristics of the chip carrier. It is a yet another feature of the invention that the base plate may be made of material having a coefficient of thermal expansion similar to that of the substrate. It is a further feature of this invention that the chip carrier socket body is made up of contact modules having contacts disposed at standard lead spacings wherein said modules are permanently attached to the base plate, thereby creating a single structure. It is a still further feature of this invention that contact modules having standard lead spacings may be molded and used with various chip carrier configurations having corresponding lead spacings.

It is an advantage of this invention that standard contacts having a tool receiving recess may be used. It is another advantage of this invention that the contact body section can be portioned to create a shorter contact module. It is a further advantage of this invention that the contact module length may be controlled, thereby minimizing the effect of the thermal expansion of the contact modules on the conductor/contact interface.

DETAILED DESCRIPTION OF THE INVENTION

In the particular embodiment of the invention shown in the drawings, a chip carrier socket assembly 2 is illustrated. The socket assembly comprises a chip carrier 4 having leads 6 extending therefrom, a socket 8 having contacts 10 therein, and a cover 12 for wedging the leads 6 into electrical engagement with the contacts 10. The contacts 10 are then electrically connected to respective conductors 14 on the substrate 16. As shown in the illustrative embodiment of the drawings, the contacts 10 are soldered onto the conductors 14 using surface mounting techniques. Other methods of creating the electrical connection may also be used.

The socket 8 is made of socket modules 22 and a base plate 20. In the socket illustrated in FIG. 1, the equivalent of the base plate 20 and modules 22 of the present invention is of monolithic molded plastic construction. In the present invention, the socket 8 comprises contact modules 22 permanently attached to a base plate 20. Each contact module 22 has a body 24, a plurality of contacts 10, and boss means 26 in a known orientation to the contacts 10 for locating the modules 22 and the contacts 10 therein in the manner described below. The body 24 has a longitudinal axis with lateral slots 30 spaced therealong for positioning the contacts 10 therein.

Figure 2:
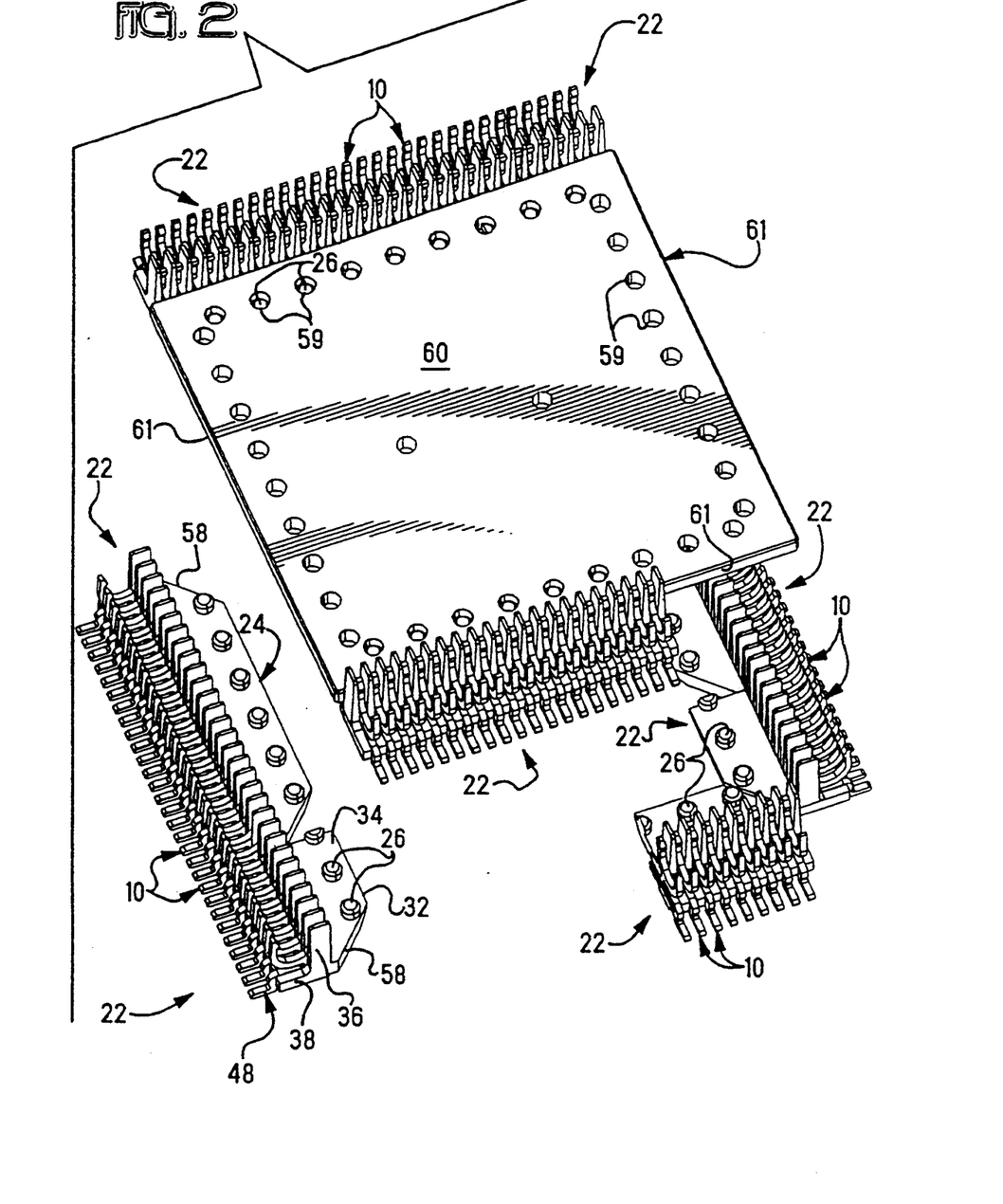
FIG. 2 is a partially exploded perspective view of a socket of the present invention.
Figure 3:
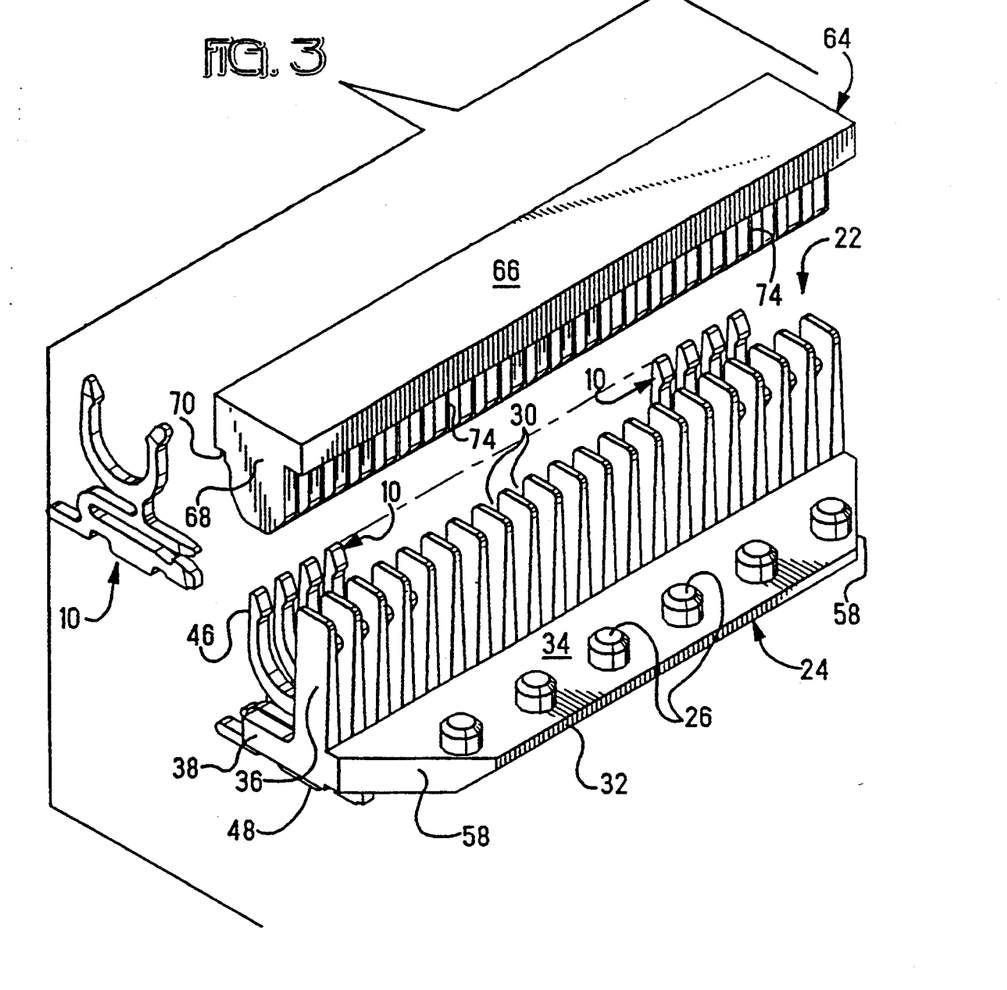
FIG. 3 is a partially exploded upper perspective view of a socket module and locking member.
Figure 4:
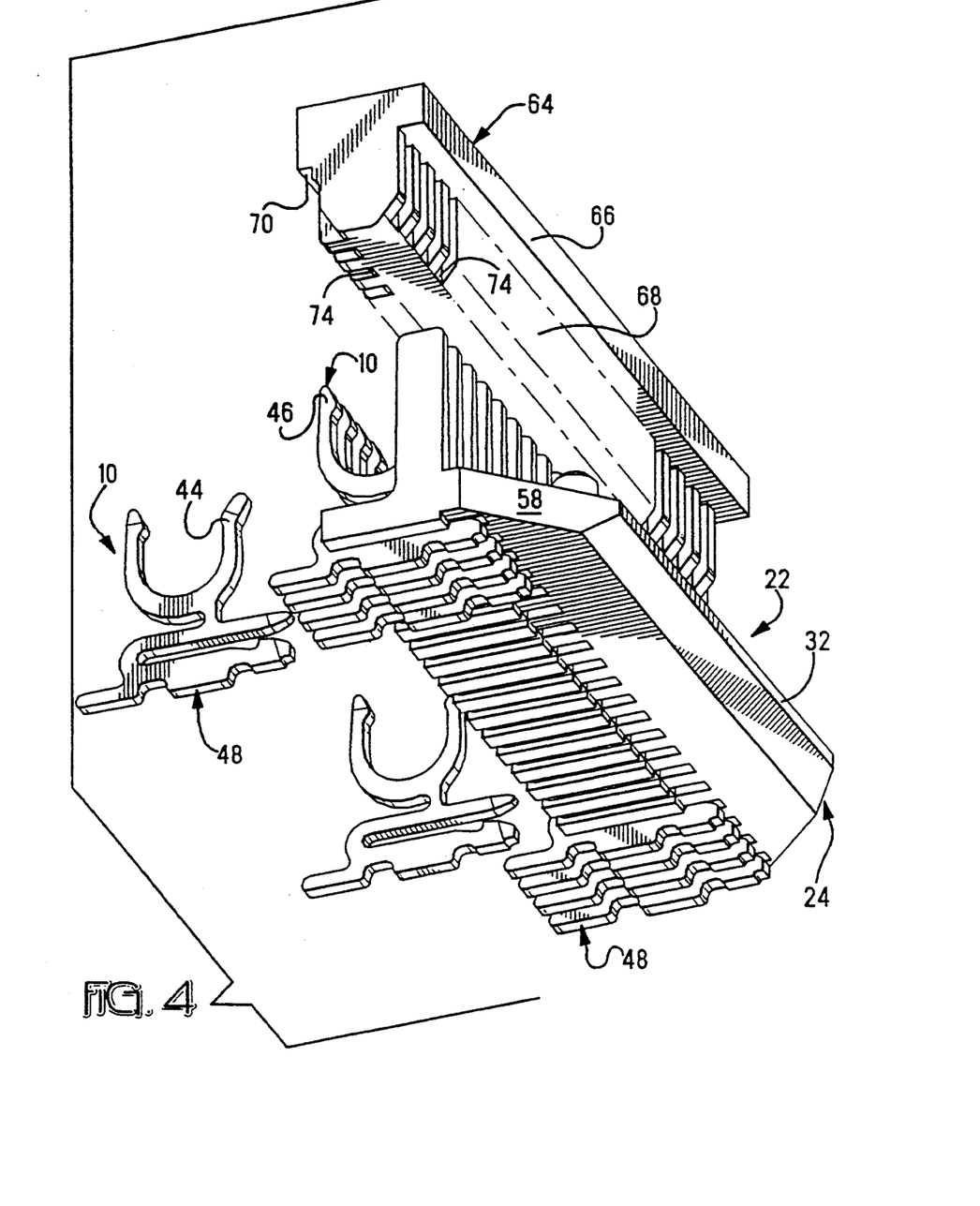
FIG. 4 is a partially exploded lower perspective view of a socket and locking member.

As best seen in FIGS. 2 and 3, the body 24 has a table 32 having a pad 34 and projecting inwardly from an upstanding wall 36, having an upper surface 37 through which the lateral slots 30 pass perpendicularly, and a flange 38 extends outwardly from the opposite side of the wall 36 than the table 32. The lateral slots 30 are cut through the flange 38 and the wall 36 leaving a rib 40. These ribs 40 are adapted for engaging and precisely locating the contacts 10 as described below. The boss means shown in the drawings extend orthogonally as cylindrical projections 26 from the pad 34 of the table 32. Because they are in a known and fixed relationship with the contacts 10, orientation of the boss 26 will also orientate the contacts 10.

Figure 5:
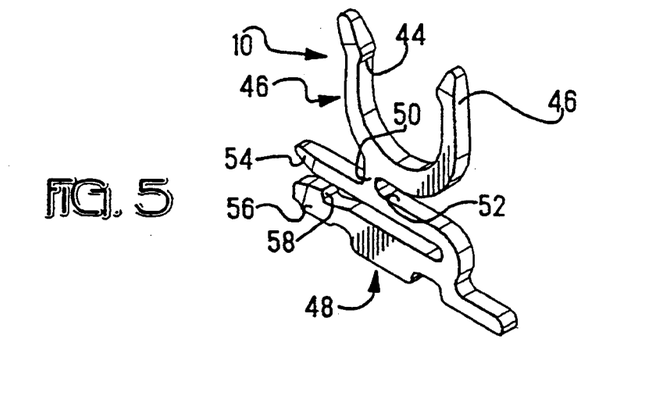
FIG. 5 is a perspective view of the contact used in the contact modules.

FIG. 5 shows a contact 10 that is usable with the present embodiment of the invention. This is a tuning fork shaped contact of the type addressed in my copending U.S. patent application No. 07/969,597 already incorporated into this application by reference. The contact has a contact portion 42 having a contact arm 44 and a backup arm 46 for electrically engaging the leads. A terminal portion 48 is adapted to electrically engage the conductor 14 and a resilient web 50 connects the two portions 42, 48, thereby providing a tool receiving recess 52 so that the contact portion 42 may be supported to prevent insertion forces from acting upon the connection at the substrate 16. These contacts 10 are shown having a surface mount terminal portion 48 adapted for various soldering techniques, although this is the presently preferred embodiment, it is not meant to be limiting as those skilled in the art would recognize that the terminal portion could be formed to extend through a plated hole in the substrate in order to provide an electrical connection.

Figure 6:
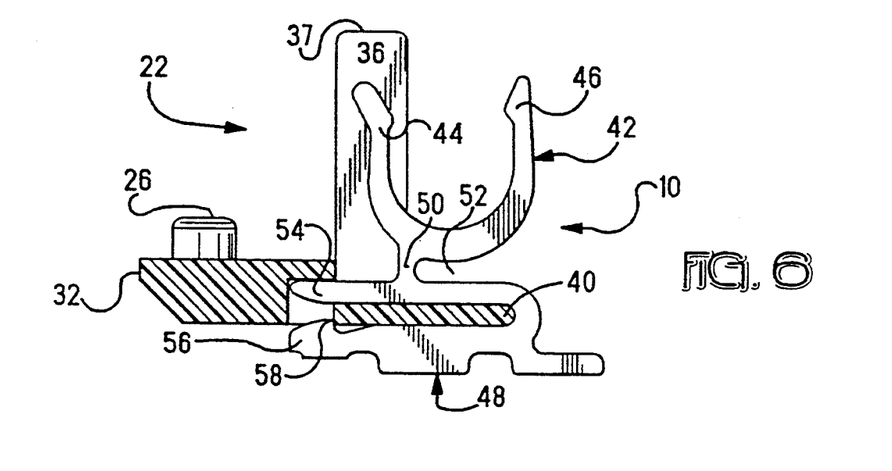
FIG. 6 is a sectional view of the contact module showing a contact attached to a rib within a slot of the contact body.

The contact 10 has a horizontally oriented U-shaped terminal portion 48 that includes an upper leg 54 and a lower leg 56 specifically adapted to slip over the rib 40 and be positively engaged thereon. A barb 58 extends from the inside of the lower leg 56 towards the upper leg 54 an amount sufficient to positively captivate the contact 10 upon the rib 40 as shown in FIG. 6.

The body 24 is further adapted so that when the terminal portion 48 of the contacts 10 are electrically engaged with their respective conductors 14 on the substrate 16 the body 24 is suspended above the substrate 16, thereby preserving valuable real estate. The wall 36 and the flange 38 are adapted to permit access to the tool receiving recess 52 once the contact 10 is assembled onto the rib 40.

It is envisioned that a number of different body configurations will be produced, most likely by a plastic molding process, having slot size and center-to-center spacing corresponding to some basic lead configurations. In the embodiment shown in the drawings, the bodies 24 are molded from a dielectric plastic 0.527 inches long and incorporate 20 contacts spaced 0.0256 inches apart. This body could also accommodate 10 of the same contacts spaced 0.0512 inches apart, thereby illustrating how the number of specific molded body components may be reduced. It is presently envisioned that molded bodies would cover slot spacing as small as 0.015 inches and slot widths as small as 0.006 inches, although as manufacturing techniques improve these limitations are also expected to be improved upon.

These molded bodies 24 can also be cut to a length shorter than the molded length in order to accommodate the various chip carrier lead configurations. It may also be possible to produce an extruded strip of great length that has the characteristics of a module body 24 allowing the strip to be cut to the precise length desired, provided that the thermal expansion of the module is not such that undue stress is imposed on the contact/conductor interface. As used in the present application the terms "contact module 22" and "module body 24" are meant to encompass all of the above. A sufficient number of bosses 26 must remain in the shorter lengths in order to assure proper orientation of the contacts 10 with the base plate 20 as described below.

By selecting contact modules 22 and including portions thereof, if required, as discussed above, a socket 8 can be created. A beveled edge 58 can either be incorporated onto the body 24 in the molding process or it is easily machined into the body 24 to enable the mating of the contact modules 22 around the perimeter of the chip carrier 4 so that the leads 6 correspond to the contacts 10.

A socket 8 of integral construction is created by providing a base plate 20 to structurally support and orientate the contact modules 22, thereby defining a socket 8 that structurally mimics the molded socket bodies of the prior art. The base plate 20 is adapted with alignment means 59 that positively engage the boss 26 of the contact module 22. Because the contacts 10 positively engage the rib 40 of the body 24, these alignment means 59, when mated with the boss 26 of the contact module 24, will cause the contact arm 44 of contacts 10 to be in alignment with the leads 6 of the chip carrier 4 and the conductors 14 on the substrate 16.

Figure 7:
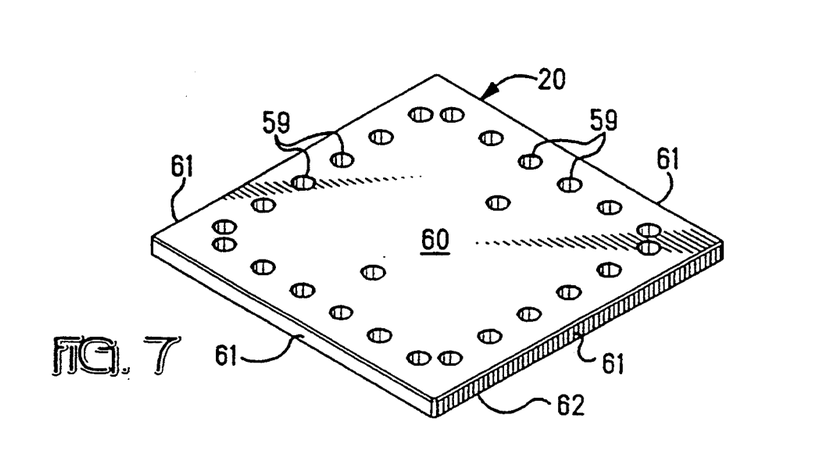
FIG. 7 is a perspective view of the base plate.

The base plate 20 shown in FIG. 7 has an upper surface 60 and a lower surface 62 which are generally planer and parallel to each other. The alignment means shown in the drawings are round holes 59 formed through the plate 20 and sized for close engagement with the boss 26. Base plate 20 also has a perimeter edge 61 therearound. The perimeter edge 61 does not serve any alignment function in the embodiment shown in the drawings. The principle design requirements are that it extends sufficiently to include the alignment means 59 without preventing the alignment means 59 to engage the bosses 26 due to interference with some part of the body 24. Other alignment features could be easily incorporated into the plate. The holes 59 could be formed to another shape providing it closely corresponds to the boss 26 on the module body 24. Although the bosses 26 are shown the drawings as being cylindrical projections, a large variety of boss 26 configurations would work. Alignment features could even be incorporated into the perimeter of the base plate to correspond with mating bosses in the module body similar to the way the pieces of a jig-saw puzzle compliment each other. A key feature of this invention is that whatever alignment features are used is that they must be easily produced to close manufacturing tolerances.

Because the base plate 20 is the only application specific component in the invention, to insure low cost, it is important that the base plate 20 be designed for easy manufacture. The base plate 20 of this invention can be manufactured by any one of a number of techniques. The material is typically the same material as the substrate, which most commonly would be a printed circuit board. This material comes in large sheets of the desired thickness. A large number of base plates 20 could be produced from a single sheet. As an example, the base plate shown in FIG. 7 is 0.548 inches square by 0.031 inches thick.

A single sheet or a number of the sheets could be placed on a computer controlled machine tool using conventional machining methods or advanced machining methods such as laser or water-jet cutting. Any configuration of base plate 20 could be produced simply by changing the program in the machine, thereby insuring the low cost and rapid response production of integral socket bodies to accommodate the user's needs.

Typically, the base plate 20 will be manufactured from the same material as the substrate 16. If it is not, it would be desirable to use material that has a similar coefficient of thermal expansion (CTE) in order to minimize the stress imposed on the contact 10 and conductor 14 interface. In use, the components upon the substrate 16 and the environment in which it operates generate significant heat which is transferred into the substrate 16 and the socket 8 causing thermal expansion. If their coefficients of thermal expansion are different the amount of expansion each component undergoes will also be different. Significant stress will be transferred into the contact/conductor connection because the terminal portion 48 of the contacts 10 are being urged out of alignment with the conductors 14.

Although not as important in the smaller socket sizes, this difference in expansions becomes quite relevant when the socket size is increased, such as a 4 inch by 4 inch socket. In some larger sockets the differences in expansions may be sufficient to cause the electrical connection between some of the contacts 10 and the conductors 14 to fail. By matching the coefficients of thermal expansion between the base plate 20 and the substrate 16 the stress imposed on the contact/conductor interface and where the base plate 20 is permanently affixed to the contact modules 22 may be minimized. In addition, the use of contact modules 22 which are of limited length will further act to keep the terminal portions 48 in line with the conductors 14 and the leads 6. The contact modules 22 are then permanently attached to the base plate 20 with the bosses 26 closely engaged with their respective alignment means 59 in order to produce an integral socket 8. In the embodiment shown in the drawings, the holes 59 in the base plate 20 fit over the bosses 26 and the lower surface 62 of the base plate 20 is permanently attached to the pad surface 34 of the table 32. The base plate 20 can be bonded thereupon or the bosses 26 can be bonded within the holes 59 through, for example, the use of compatible epoxy. Other assembly techniques, such as staking the bosses 26 within the holes 59 or ultra-sonic welding, would be apparent to one skilled in the assembly arts.

Figure 8:
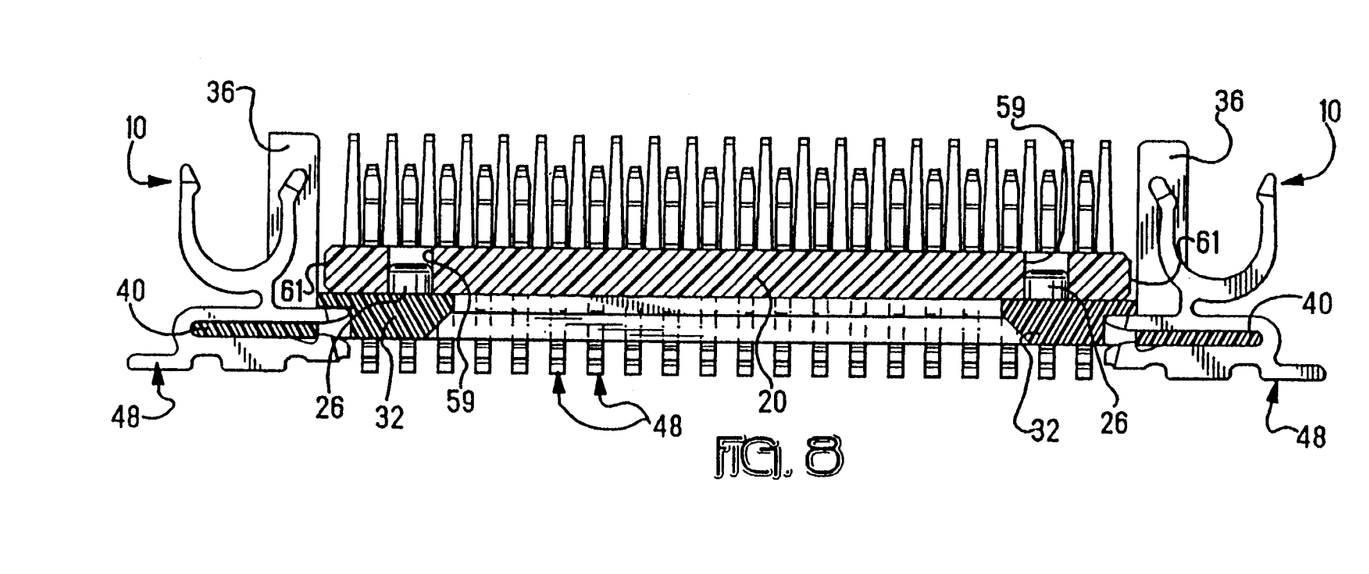
FIG. 8 side sectional view of the chip carrier socket.

Once the contact modules 22 and the base plate 20 are permanently affixed to each other forming an integral socket 8 (as shown in FIG. 8), the socket 8 of the present invention will have all the structural characteristics of the prior art monolithic molded plastic socket body 1 and the improved thermal expansion characteristics realized through the use of a base plate 20 having a similar coefficient of thermal expansion as the substrate 16. After the modules 22 are permanently affixed to the base plate 20, the modular socket 8 can be electrically connected to the conductors 14 on the substrate 16. In the embodiment shown in the drawings, this would be through surface mounting techniques, such as reflow soldering. Note, because this socket 8 is of integral construction it is possible to remove the socket 8 from the substrate 16 as a single unit at the soldered contact 10/conductor 14 interface and easily replace it with another in the event that rework is necessary.

Figure 9:
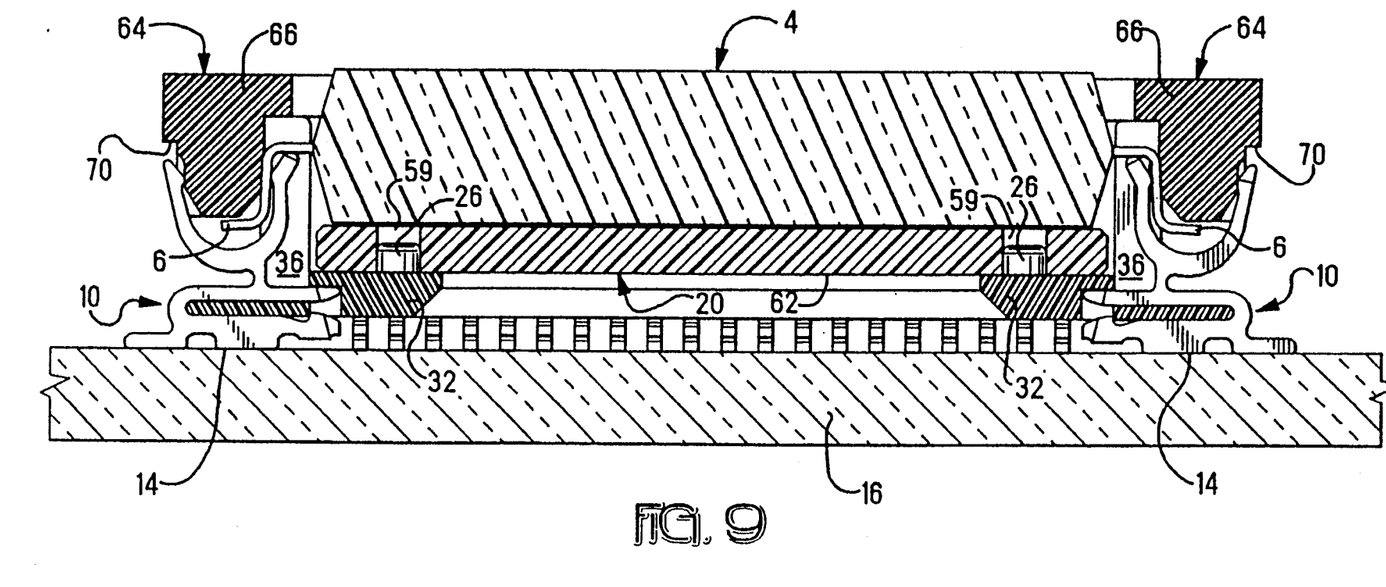
FIG. 9 is a side sectional view of a chip carrier socket assembly.

After the socket 8 has been electrically connected to the conductors, the particular chip carrier 4 is placed in the socket 8 with its leads 6 corresponding to respective contacts 10. The leads 6 are then wedged into electrical engagement with the contact arm 44 by a locking member 64. These locking members 64 take the place of the molded cover 19 shown in FIG. 1. A chip carrier socket assembly utilizing the present invention is shown in FIG. 9.

The locking members 64 have a top flange 66, a rail 68 that projects downwardly and a lip 70 where the top flange 66 and the rail 68 meet. The bottom of the rail is adapted to wedge the leads into electrical engagement with the contact arm 44 when the locking member 64 is pressed downwardly between the contact arm 44 and the back-up arm 46 as shown in FIG. 9. The locking member 64 may be molded of a length substantially identical to a contact module 22 or may be cut from an extrusion to a length corresponding to a side of the socket 8. The locking member 64 may even be slightly longer than the contact module 22 to enable removal of the locking member 64 by prying the member 64 from between the two contact arms 44, 46. The locking member 64 may also have indentations 74 corresponding to the arms 44, 46 of the contacts 10 to enhance the engagement with the contacts 10 and leads 6.

While the embodiment shown in the drawings pertains to a chip carrier socket assembly 2 having contacts spaced around four sides, it is an object of this invention to have the flexibility to produce low-cost sockets for any chip carrier lead configuration. The various configurations can be produced simply. The first step is analyzing the chip carrier 4 lead 6 configuration and the configuration of the conductors 14 on the substrate 16 to determine where the contact arm 44 of the contacts 10 needs to be placed for electrically connecting the leads 6 to the conductors 14 on the substrate 16. Based on the lead 6 spacing determined in the first step, the second step involves the selection of pre-manufactured molded contact body 22, and portions of the contact modules 22, that will make up the socket 8. The third step is placing contacts 10 in their respective slots of the contact body 24 corresponding to the orientation with the leads 6 in order to create a contact module 22. The fourth step is to develop the base plate 20, whereby its size and alignment means 59 are formed based on the geometry of the contact modules 22, the location of the bosses 26 relative the contacts 10, in order to position the contact arm 44 of the contacts 10 for the electrical connection of the leads 6 to the contacts 10 and the contacts 10 to the conductors 14. The fifth step is to create a chip carrier socket 8 of integral construction by engaging the alignment means 59 of the base plate 20 with the bosses 26 of the contact modules 22 and permanently affixing the contact modules 22 to the base plate 20. In the final step, if required, locking members 64 are formed to correspond to the contacts 10 within the socket 8 to wedge the leads 6 into electrical engagement with contact arm 44.

It will be appreciated that the present invention has significant advantages for the electrical connection of chip carrier leads to the conductors on a substrate through the use of a socket assembly. Although this invention was described with reference to a four sided socket it will be apparent that it is just as applicable to any chip carrier lead configuration. Therefore, it should be recognized that the above described embodiment constitutes the presently preferred form of the invention and that the invention can take numerous other forms. Accordingly, the invention should be limited only as required by the scope of the following claims.

I claim:

1. A modular chip carrier socket for electrically connecting spaced apart leads extending from a peripheral edge of a chip carrier to respective conductive areas of a substrate, said socket comprising:

a contact module having
an elongate body defining a longitudinal axis and including a wall extending along said axis and a table having a pad extending to an inner side, said body including a plurality of slots formed laterally to the longitudinal axis and extending into the body from an outer side and in communication with a top surface thereof;

a plurality of contacts retained within respective ones of at least some of the slots and corresponding to the leads to be electrically connected to the conductive areas on the substrate, said contacts having a contact portion at least exposed along the top surface of the body and adapted to electrically engage the leads and a terminal portion at least exposed along a bottom surface of the body and adapted to electrically engage the conductive areas;

boss means extending orthogonally from the pad of the table and positioned with respect to the slots and the contacts therein; and a base plate having two major planar surfaces and a peripheral edge therearound with alignment means defined therein and selectively positioned therealong, said alignment means adapted to engage said boss means of the contact module, the alignment means being positioned and oriented upon the base plate so that when the alignment means engage the boss means, the contact portions of the contacts within the contact module correspond to the leads and the terminal portions of said contacts within the contact module correspond with the respective conductive areas on the substrate, and said base plate being permanently affixed to the contact module after the alignment means are co-operatively engaged with their respective boss means and prior to assembly of the modular chip carrier socket to the substrate, whereby a robust socket of integral construction is produced simulating structurally the monolithic construction of molded sockets.

2. The modular chip carrier socket of claim 1, wherein the base plate has a coefficient of thermal expansion matched to the substrate.

3. The modular chip carrier socket of claim 1, wherein the boss means is a cylindrical projection and the alignment means within the base plate are adapted to mate in a close fit with the cylindrical projections.

4. The modular chip carrier socket of claim 1, wherein the alignment means within the base plate are holes adapted to mate in a close fit with the boss.

5. The modular chip carrier socket of claim 3, wherein the alignment means are cylindrical holes.

6. The modular chip carrier socket of claim 1, wherein the base plate is bonded to the pad of the table.

7. The modular chip carrier socket of claim 1, wherein the alignment means are bonded to the boss means.

8. The modular chip carrier socket of claim 1, wherein the contact module is permanently affixed to the base plate with an epoxy.

9. The modular chip carrier socket of claim 1, wherein the terminal portion of the contacts is surface mounted to the conductive areas on the substrate by solder.

10. The modular chip carrier socket of claim 1, wherein the contacts further include a tool receiving recess between the contact portion and the terminal portion, said tool receiving recess being exposed on the outward side of the contact module.

* * * * *